(12) United States Patent
Förster et al.

(10) Patent No.: US 7,390,737 B2
(45) Date of Patent: Jun. 24, 2008

(54) METHOD FOR FILLING A CONTACT HOLE AND INTEGRATED CIRCUIT ARRANGEMENT WITH CONTACT HOLE

(75) Inventors: Jürgen Förster, Tegernheim (DE); Klemens Prügl, Regensburg (DE); Berthold Schuderer, Regensburg (DE)

(73) Assignee: Infineon Technologies Ag, Munich (DE)

( * ) Notice: Subject to any disclaimer, the term of this patent is extended or adjusted under 35 U.S.C. 154(b) by 278 days.

(21) Appl. No.: 10/511,851

(22) PCT Filed: Mar. 17, 2003

(86) PCT No.: PCT/DE03/00861

§ 371 (c)(1),
(2), (4) Date: Aug. 25, 2005

(87) PCT Pub. No.: WO03/094225

PCT Pub. Date: Nov. 13, 2003

(65) Prior Publication Data

US 2006/0024946 A1    Feb. 2, 2006

(30) Foreign Application Priority Data

Apr. 29, 2002   (DE) ............................. 102 19 115

(51) Int. Cl.
*H01L 21/4763* (2006.01)

(52) U.S. Cl. ................................. 438/629; 257/E21.507

(58) Field of Classification Search .................. 438/629; 257/E21.507

See application file for complete search history.

(56) References Cited

U.S. PATENT DOCUMENTS

| 5,668,411 | A  | 9/1997  | Hong et al. |
| 5,893,752 | A  | 4/1999  | Zhang et al. |
| 5,963,827 | A  | 10/1999 | Enomoto et al. |
| 6,028,003 | A  | 2/2000  | Frisa et al. |
| 6,242,804 | B1 | 6/2001  | Inoue |
| 6,271,592 | B1 | 8/2001  | Kim et al. |
| 6,316,132 | B1 | 11/2001 | Karp ........................ 348/143 |

FOREIGN PATENT DOCUMENTS

| DE | 195 22 660 A1 | 4/1996 |
| EP | 0 598 422 A1  | 10/1993 |
| EP | 0 658 926 A1  | 11/1994 |
| EP | 0 685 876 A2  | 6/1995 |
| EP | 0735586 A2    | 10/1996 |
| EP | 0791663 B1    | 1/2001 |
| WO | WO 99/53114   | 10/1999 |

OTHER PUBLICATIONS

European Office Action dated Aug. 30, 2007. English Translation included.

*Primary Examiner*—Scott B. Geyer
*Assistant Examiner*—Elias Ullah
(74) *Attorney, Agent, or Firm*—Brinks, Hofer, Gilson & Lione

(57) ABSTRACT

A method in which a base layer is deposited in a contact hole region under a protective gas, where base layer contains a nitride as main constituent. After the deposition of the base layer, a covering layer is deposited under gaseous nitrogen. An adhesion promoting layer results which is simple to produce and has good electrical properties.

14 Claims, 4 Drawing Sheets

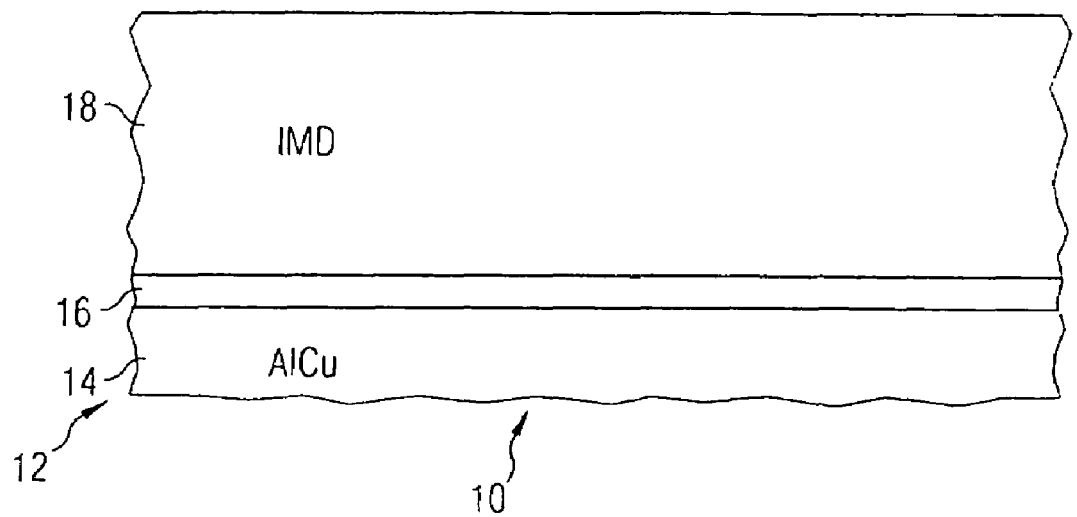
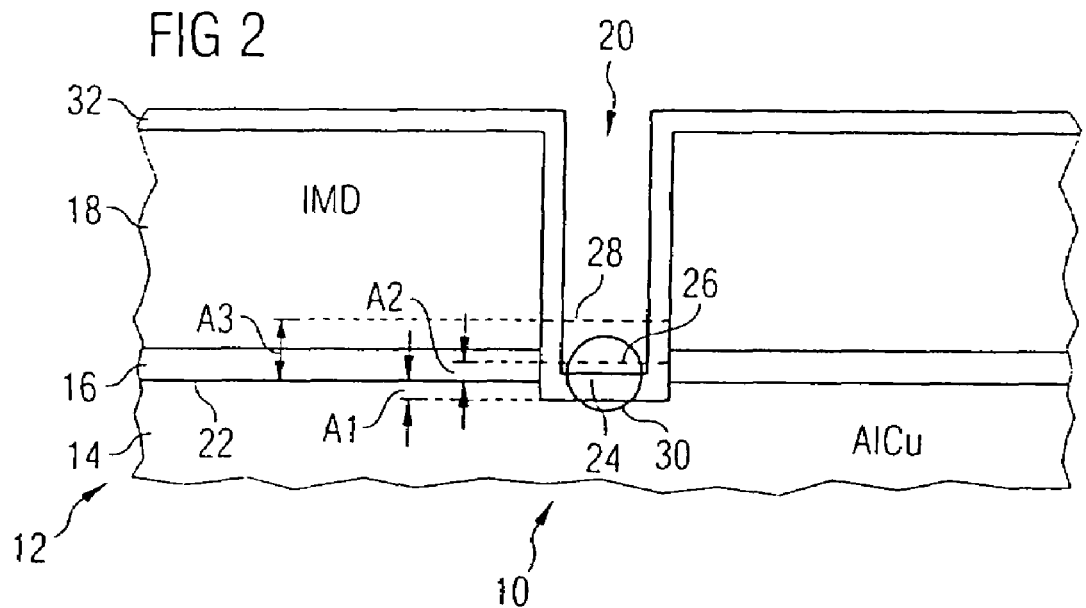

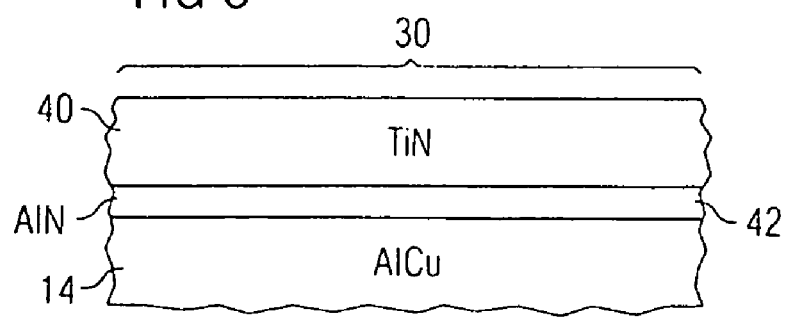
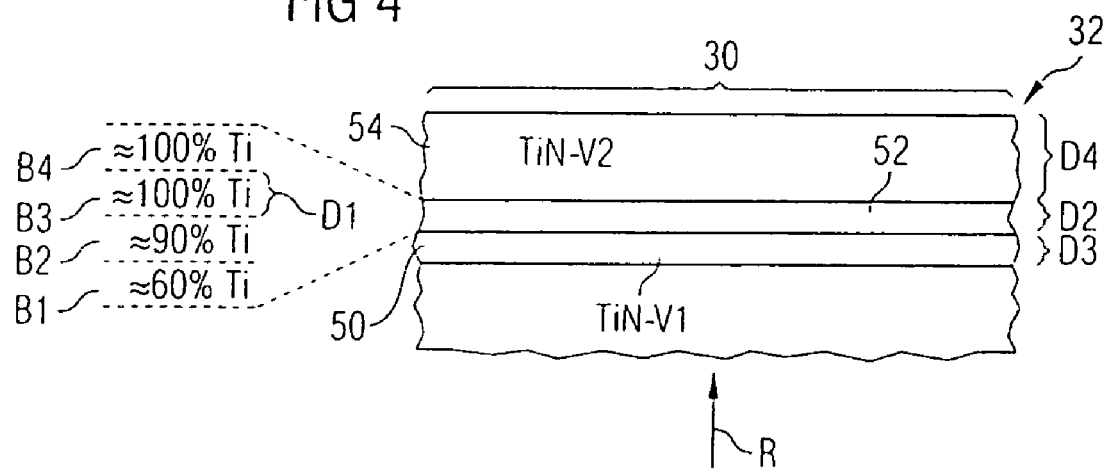

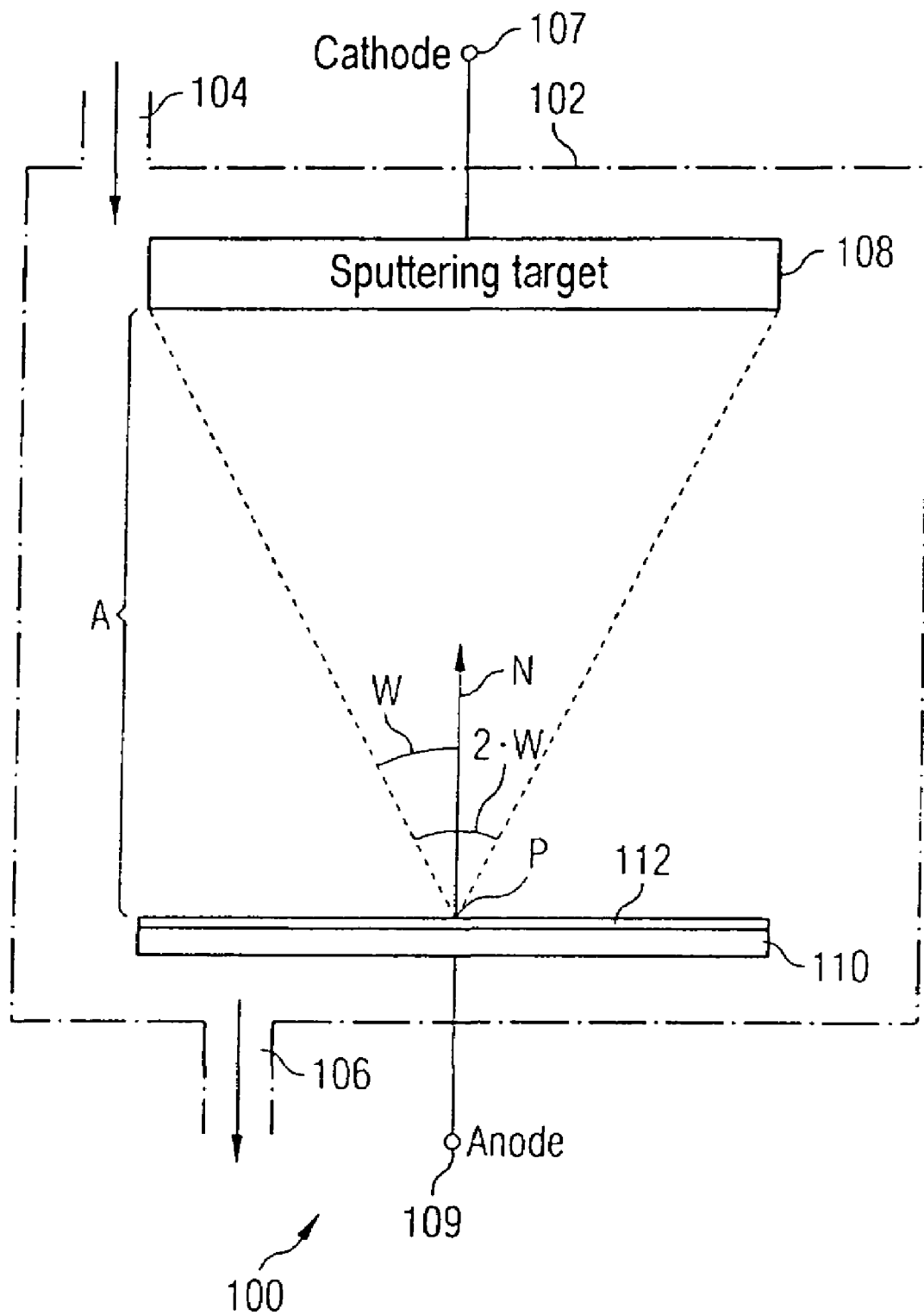

ND INTEGRATED CIRCUIT
METHOD FOR FILLING A CONTACT HOLE AND INTEGRATED CIRCUIT ARRANGEMENT WITH CONTACT HOLE

This application claims the benefit of priority to German patent application no. DE 10219115.8, filed Apr. 29, 2002.

TECHNICAL FIELD

The invention relates to a method for filling a contact hole, in which a covering layer is deposited in the contact hole, which covering layer contains a nitride as main constituent.

The contact hole lies between two metal layers. Such contact holes are also referred to as vias.

The covering layer is part of a so-called liner layer which serves as a mechanical adhesion promoting layer between a metal to be contact-connected and the contact hole filling. Titanium nitride or tantalum nitride, for example, is used as material for the adhesion promoting layer in order, for example in the case of a line section made of aluminium or an aluminium alloy and lying below the contact hole, to fill the contact hole with tungsten or a tungsten compound. Adhesion promoting layers which contain a nitride have good adhesion promoting properties and can be produced comparatively simply by sputtering under nitrogen.

SUMMARY

It is an object of the invention to specify a simple method for filling a contact hole which, in particular, ensures reliable contact connection and a low contact resistance. Moreover, the intention is to specify an associated integrated circuit arrangement.

It is an object of the invention to specify a simple method for filling a contact hole which, in particular, ensures reliable contact connection and a low contact resistance. Moreover, the intention is to specify an associated integrated circuit arrangement.

The object relating to the method is achieved by means of the method steps specified in Patent claim 1. Developments are specified in the subclaims.

In the case of the method according to the invention, a base layer is deposited in the contact hole under a protective gas, which base layer contains a nitride as main constituent. It is only after the deposition of the base layer that the covering layer is then deposited under gaseous nitrogen.

By virtue of the fact that firstly the base layer is deposited under a protective gas, no disturbing nitride compounds between the metal at the bottom of the contact hole and nitrogen contained in a reactive gas form on the metal at the bottom of the contact hole in the case of the method according to the invention. A metal nitride layer is nevertheless formed directly on the metal in the case of the method according to the invention, in order e.g. to form a good electrical contact and to avoid or to reduce undesirable effects or compounds between a pure metal and the metal at the bottom of the contact hole. Thus, e.g. TiAl$_3$ would be disturbing because it has a density which deviates considerably from the density of the materials surrounding it. Moreover, TiAl$_3$ is granular and has a non-uniform structure which fosters electromigration.

During the subsequent deposition of the covering layer and a gaseous nitrogen, on account of the base layer that has already been deposited, the nitrogen can no longer penetrate as far as the metal at the bottom of the contact hole in order to form a disturbing nitride there. Therefore, the covering layer can be produced by a simple method for deposition, namely that using a nitrogen atmosphere.

In one development of the method according to the invention, the base layer and the covering layer are deposited by directional sputtering. Whereas non-directional sputtering methods are well suited to the deposition of material on a planar area, directional sputtering affords the possibility of depositing sufficient material of the base layer and of the covering layer even in the narrow contact hole, and in particular on the bottom of the contact hole, without resulting in excessively large differences in the thickness of the base layer and of the covering layer inside and outside the contact hole. Since such differences are avoided or considerably reduced by directional sputtering, the method in accordance with the development can be incorporated in a simple manner into the overall process for producing an integrated circuit arrangement.

In a next development of the method according to the invention, an intermediate layer is deposited in the contact hole after the deposition of the base layer but before the deposition of the covering layer. The deposition of the intermediate layer affords the possibility of effecting continuous transition from the method for depositing the base layer to the method for depositing the covering layer. By way of example, process gases can be exchanged in this time. Moreover, incorporating an intermediate layer with a material which differs from the material of the base layer and from the material of the covering layer, because it is nitride-free, results in a degree of freedom for producing a layer stack with improved mechanical adhesion properties and/or with improved electrical contact properties and/or with improved other properties, e.g. with regard to the prevention of diffusion or electromigration. Thus, it is possible to considerably improve the adhesion properties of the contact hole filling that is to be introduced later, in the contact hole itself, by means of an intermediate layer which contains titanium as main constituent, i.e. which comprises e.g. titanium or in which at least 80% of the atoms are titanium atoms.

In other developments, the surface of a sputtering target is firstly nitrided under a nitrogen atmosphere. The nitrided surface is then removed during the production of the base layer. The intermediate layer is then removed from an essentially nitride-free surface of the sputtering target, the protective gas remaining unchanged. The conditions for producing the covering layer are then prescribed by the change to a different atmosphere. These measures form a simple but effective method for prescribing the process conditions during the production of the layer stack for filling the contact hole. In particular, the entire method can be carried out without changing the process chamber.

In a next development, the contact hole is introduced into a dielectric carrier material as far as an electrically conductive connecting section which contains, as main constituent, aluminium, an aluminium alloy or a different metal, e.g. copper or a copper alloy. Such a deeply penetrating contact hole, too, can be filled well by the method according to the invention, in particular because no gaseous nitrogen reaches the bottom of the contact hole. Thus, by way of example, the formation of disturbing aluminium nitride, as explained above, is avoided by other measures, namely in particular by the production of the base layer under a protective atmosphere.

In a next development, a multiplicity of contact holes are etched simultaneously during the processing of a semiconductor wafer. The semiconductor wafer has a diameter of 150 to 300 mm, for example. This size means that the etching conditions are not identical at all locations of the semiconductor wafer. By way of example, etching takes place more rapidly at the edge of the semiconductor wafer than in the center of the semiconductor wafer. The thickness of the dielectric layer outside contact holes also varies at different locations of the semiconductor wafer. By virtue of the method according to the invention, it is possible that, in the case of the development, although an auxiliary layer lying between the dielectric layer and a metal layer is prescribed as a desired point for an etching stop, the auxiliary layer is nonetheless permitted to be etched through, in particular in a partial region of the semiconductor wafer. All of the contact holes subsequently have good electrical properties despite the different etching conditions and thickness conditions. In particular in the case of a low etching selectivity between the dielectric layer and the auxiliary layer, the measures mentioned enable a large process window during the etching. The thickness of the auxiliary layer can also be reduced.

The auxiliary layer has properties, for example, which make it possible to avoid or reduce electromigration. Even if the auxiliary layer is etched through, this is not disturbing because later a liner layer is applied which has similar properties to the auxiliary layer with regard to avoiding electromigration. The similar properties result e.g. from the use of identical materials and layer sequences in the auxiliary layer and the liner layer.

In another development, a contact hole filling is deposited after the deposition of the covering layer in the contact hole, which contact hole filling contains tungsten as main constituent. Even when the intermediate layer is composed of titanium, the formation of disturbing titanium fluoride during the introduction of the tungsten can be avoided or considerably reduced because the intermediate layer is embedded between the base layer and the covering layer and, moreover, can be made so that it is only thin, e.g. thinner than 10 mm.

In a next development, the thickness of the covering layer is less than about 20 nm. Such a small thickness is not disturbing even when the contact hole is filled with tungsten. The formation of titanium fluoride and the resultant lifting-off of the layer stack from the contact hole need no longer be feared. Therefore, the layer thickness, in particular of the covering layer, which is otherwise enlarged in order to avoid the lifting-off can also be reduced again, for example to the size mentioned.

In one development, the contact hole has a diameter of less than 1 µm. The depth of the contact hole is greater than 500 nm. Given a diameter of about 500 nm and a depth of 1 µm, the aspect ratio is two. However, even with aspect ratios of up to about three, the method according to the invention can still be carried out reliably because, particularly in the case of a directional sputtering method, the difference in thickness of the layers inside and outside a contact hole remains within tenable limits.

In a next development, one or more of the materials titanium nitride or tantalum nitride is used as material for the base layer and/or the covering layer. In these cases, titanium or tantalum is suitable as material for the intermediate layer.

The invention additionally relates to an integrated circuit arrangement which contains the filled contact hole, in particular including the base layer and the covering layer. In one development, the circuit arrangement is produced by the method according to the invention or one of its developments. Thus, the effects mentioned above also apply to the circuit arrangement and the development thereof.

BRIEF DESCRIPTION OF THE DRAWINGS

The invention is explained below with reference to the accompanying figures, in which:

FIG. 1 shows a dielectric layer of an integrated circuit arrangement,

FIG. 2 shows a contact hole etched into the dielectric layer,

FIG. 3 shows an adhesion promoting layer to be arranged in the contact hole, in accordance with one variant, FIG. 4 shows partial layers of an adhesion promoting layer introduced into the contact hole, FIG. 5 shows a sputtering chamber used for introducing the adhesion promoting layer.

DETAILED DESCRIPTION

Figure 6:
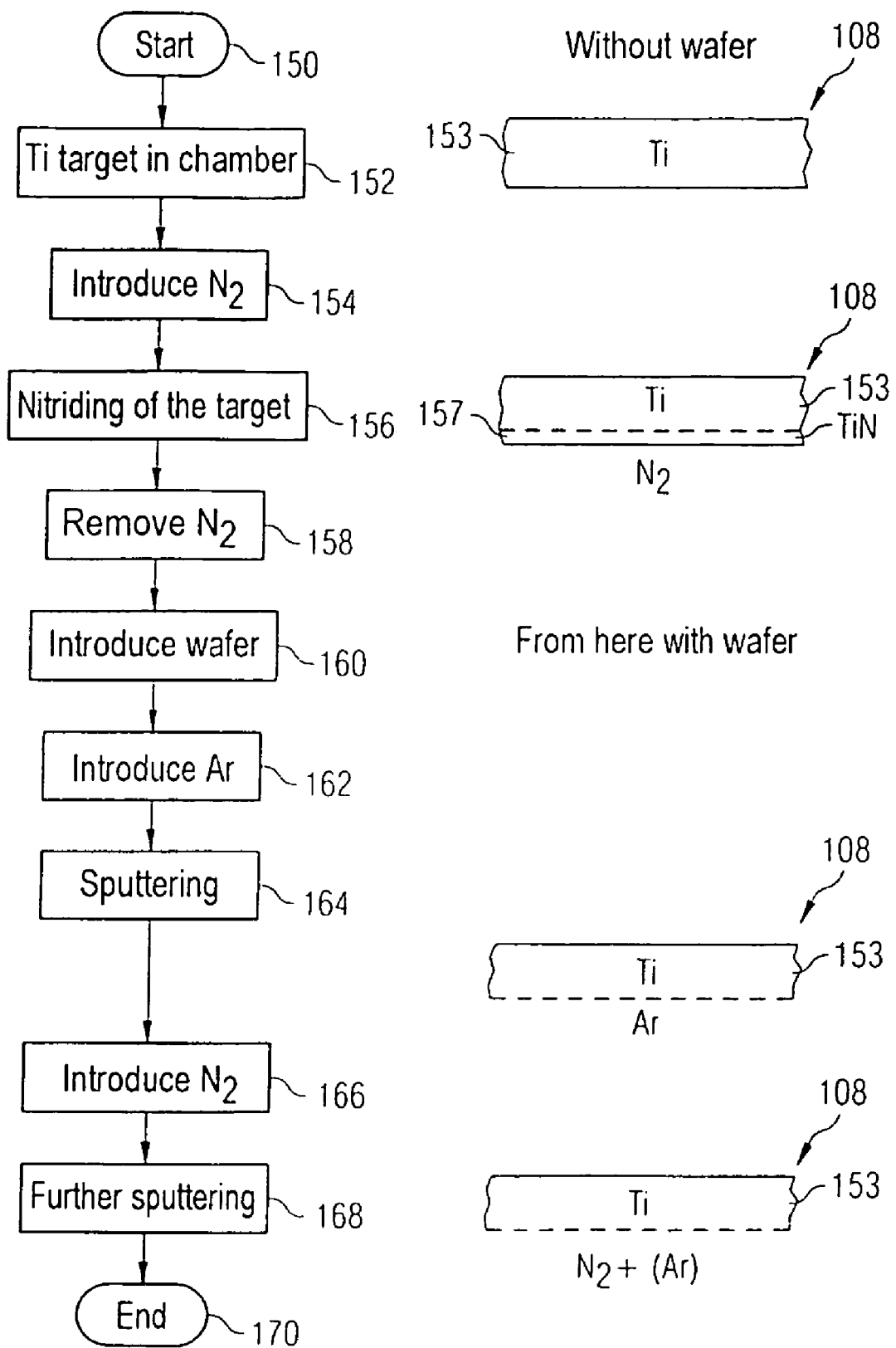
FIG. 6 shows method steps carried out during the production of the adhesion promoting layer.

FIG. 1 shows an integrated circuit arrangement 10 during production. In a semiconductor substrate (not illustrated) of the integrated circuit arrangement 10, a multiplicity of electrical components such as transistors have already been fabricated, e.g. in accordance with CMOS technology, in accordance with BICMOS technology or in accordance with a technology for power switching elements (power devices). The production was then continued until the application of a metal layer 12.

The metal layer 12 contains a connecting section 14 made of an aluminium-copper alloy containing e.g. 0.5% copper. An antireflection layer 16 comprising titanium nitride, for example, or containing at least one titanium nitride layer was sputtered onto the metal layer 12. The antireflection layer 16 was required for patterning the metal layer 12 in a photolithographic process during which the connecting section 14 was also patterned.

After the deposition of the antireflection layer 16, a dielectric layer 18 was deposited with a thickness of 600 nm, for example, e.g. with the aid of a CVD method (Chemical Vapour Deposition). The dielectric layer comprises silicon dioxide, for example, and serves for electrical insulation between the metal layer 12 and a metal layer that is still to be arranged in the dielectric layer 18.

FIG. 2 shows the circuit arrangement 10 after the etching of a contact hole 20, which extends through the dielectric layer 18 and the antireflection layer 16 right into the connecting section 14. Between a lower surface 22 and a contact hole bottom 24 of the contact hole 20 there is a distance A1 of 10 nm, for example. The diameter of the contact hole is 0.5 µm, for example.

The etching process for etching the contact hole 20 is conducted such that, for a large part of contact holes of the circuit arrangement 10, the bottom 26 of the contact hole lies in the center of the antireflection layer 16. Between the bottom 26 of the contact hole and the lower surface 22 of the antireflection layer 16 there is then a distance A2 of a few nanometres. In this process implementation, there are no contact holes in which the bottom 28 of the contact hole lies above the antireflection layer 16. Between the bottom 28 of the contact hole and the lower surface 22 there would then be a distance A3 which is greater than the distance A2 and also greater than the thickness of the antireflection layer 16. The contact hole 20 has a central region 30, which is shown in enlarged illustration in FIGS. 3 and 4.

After the etching of the contact hole 20, an adhesion promoting layer 32 is deposited, the construction of which is explained in more detail below with reference to FIG. 4.

FIG. 3 shows a titanium nitride layer 40 which could be deposited in the contact hole 20 as adhesion promoting layer. If this were done under a reactive nitrogen atmosphere, then an aluminium nitride layer 42 would form between the titanium nitride layer 40 and the connecting section 14, which aluminium nitride layer considerably increases the contact resistance.

By contrast, FIG. 4 shows the construction of the adhesion promoting layer 32 actually deposited in the contact hole 20, the said adhesion promoting layer containing a base layer 50 made of titanium nitride, an intermediate layer 52 and a covering layer 54 made of titanium nitride. The base layer 50, the intermediate layer 52 and the covering layer 54 were sputtered in the order mentioned by a method which is explained in more detail below with reference to FIG. 6.

The intermediate layer 52 comprises a mixture of titanium nitride and titanium in lower regions B1 and B2, the proportion of titanium increasing in the regions B1 and B2, starting from the base layer 50, and reaching 100% in a region B3 adjoining the region B2. Equally, the proportion of titanium nitride decreases from 100% to 0%. The proportion of titanium in the center of the region B1 and of the region B2 is, for example, 60% and 90%, respectively. The proportion of titanium is also 100% in a region B4 lying above the region B3. The regions B1 to B2 have identical thicknesses D1 of 0.5 nm, for example, so that a total thickness D2 of the intermediate layer 52 is 2 nm. A thickness D3 of the base layer 50 is 3 nm in the exemplary embodiment. A thickness D4 of the covering layer is 10 nm. The thicknesses D1 to D4 relate to the extent of the layers in a stack direction R, in which the layers 50 to 54 are stacked one above the other and which lies at right angles to the surface of the semiconductor substrate.

FIG. 5 shows a sputtering chamber 100 used for introducing the adhesion promoting layer 32. A receptacle 102 has a gas inlet 104 and a gas outlet 106. The receptacle additionally contains a sputtering target 108 made of titanium, which serves as cathode 107 and a wafer holder 110, which serves as anode 109. The wafer holder 110 carries a wafer 112, e.g. an 8 inch wafer (1 inch=25.4 mm). The sputtering target 108 has e.g. the same diameter as the wafer.

The sputtering chamber 100 is suitable for directional sputtering because a distance A between sputter target 108 and wafer 112 has been considerably increased in comparison with a sputtering chamber for non-directional sputtering, for example by a factor of four to five. Thus, the distance A is about 25 cm in the exemplary embodiment. Between the connecting line from a point P in the centre of the wafer 112 toward the edge of the sputtering target 108 and the normal N to the main surface of the wafer 112 there is an angle W, which is less than 45°, in particular less than 30°, in the case of directional sputtering.

However, directional sputtering can also be achieved or enhanced by measures other than a large distance A, e.g. by reducing the pressure within the sputtering chamber 100, e.g. to only 1 to 2 millitorr, or by suitable bias voltages during sputtering. Other methods also lead to directional sputtering, e.g.:

the use of an IMP method (Ionized Metal Plasma) from the company Applied Materials,
the use of an SIP method (Self Ionized Plasma) from the company Applied Materials,
the use of the Advanced High Fill method from the company Trikon,
the use of the Ultra High Fill method from the company Trikon,
or the use of older sputtering with a collimator.

Thus, directional sputtering can be differentiated from non-directional sputtering by an angle W of less than 45° or less than 30° or else by other measures which lead to the same effect as a small angle W with regard to the ratio of the layer thicknesses inside and outside a contact hole 20.

FIG. 6 shows method steps carried out during the production of the adhesion promoting layer 32. The method begins in a method step 150. In a method step 152, the sputtering target 108 is inserted into the sputtering chamber 100 in order to utilize it for a multiplicity of sputtering processes. The sputtering target 108 contains a titanium layer 153 made of pure titanium.

In a subsequent method step 154, nitrogen gas is introduced into the sputtering chamber 100. The nitrogen brings about a nitriding of the reactive titanium layer 153. A thin titanium nitride layer 157 is therefore produced at the surface of the titanium layer 153.

After the nitriding, in a method step 158, the supply of nitrogen is interrupted and the nitrogen contained in the sputtering chamber 100 is extracted by suction. In a next method step 106, the wafer 112 is fixed on the wafer holder 110 in the sputtering chamber.

In a method step 162, a protective gas, for example argon, is introduced into the sputtering chamber 100. Under the argon atmosphere that forms, sputtering is begun in a method step 164, the base layer 50 being deposited on the wafer 112. If the last parts of the titanium nitride layer 157 and then parts of the titanium layer 153 are sputtered away, then the intermediate layer 52 is likewise formed under the argon atmosphere.

After the deposition of the intermediate layer 52, in a method step 166, nitrogen is introduced into the sputtering chamber 100 in addition to the protective gas or instead of the protective gas. The sputtering can be interrupted in this case in order to produce reproducible layers. In a method step 168, the sputtering is continued by reigniting the plasma, the covering layer 54 being formed. In a method step 170, the method is ended if the covering layer 54 and thus also the adhesion promoting layer 32 have reached their predetermined thickness.

Without changing the sputtering target 108, the method explained is carried out a number of times in succession.

Later, in a different chamber, tungsten is introduced into the contact hole that has already been lined with the adhesion promoting layer 32. Afterwards, still further metal layers of the integrated circuit arrangement 10 are produced.

The invention claimed is:

1. A method for filling a contact hole, comprising:
   depositing a base layer in at least one contact hole under a protective gas atmosphere,
   wherein the base layer comprises titanium nitride;
   depositing a covering layer under gaseous nitrogen atmosphere in the contact hole after depositing the base layer
   wherein the covering layer comprises titanium nitride, and
   wherein depositing the base layer under a protective gas substantially prevents the formation of nitride compounds in the titanium nitride at the bottom of the contact hole by reaction with nitrogen contained in the gaseous nitrogen; and
   depositing a contact hole filling material comprising tungsten in the contact hole after depositing the covering layer,
   wherein the covering layer at the bottom of the contact hole, has a thickness of less than about 10 nm.

2. The method according to claim 1, wherein the base layer or the covering layer or both are deposited by directional sputtering.

3. The method according to claim 2 wherein depositing a base layer comprises sputtering the base layer from the surface of a sputtering target, that is nitrided before depositing the base layer.

4. The method according to claim 1, further comprising depositing an intermediate layer by directional sputtering in the contact hole after depositing the base layer and before depositing the covering layer wherein at least about eighty percent of the atoms of the intermediate layer comprise titanium atoms.

5. The method according to claim 4, wherein depositing the base layer and the covering layer and the intermediate layer comprises sputter deposition using the same sputtering target.

6. The method according to claim 4, wherein depositing the base layer and the intermediate layer, comprises forming a composite layer at the bottom surface of the contact hole having a thickness of less than about 5 nm.

7. The method according to claim 1, wherein depositing an intermediate layer comprises forming at least one region by sputtering from a nitride-free surface of a sputtering target under a protective gas atmosphere.

8. The method according to claim 1 further comprising forming the contact hole in a dielectric layer to expose an electrically conductive connecting section, wherein the connecting section comprises one of aluminum or an aluminum alloy as a main constituent.

9. The method according to claim 8, further comprising forming an auxiliary layer or the electrically conductive connecting section and etching a plurality of contact holes in the dielectric layer, wherein the electrically conductive auxiliary layer is used as a stop layer during the etching.

10. The method according to claim 1 wherein depositing a contact hole filling material is deposited comprises depositing using tungsten hexafluoride.

11. The method according to claim 1 further comprising forming the contact hole to have a diameter of less than about 1 μm, and to a depth of greater than 500 nm.

12. An integrated comprising:
    at least one contact hole, in which a base layer and a covering layer comprising titanium nitride are arranged,
    wherein the base layer adjoins a connecting section comprising one of substantially nitride-free aluminium or an aluminium alloy arranged between the connecting section and the base layer, and
    wherein the contact hole contains a filling material comprising tungsten, and
    wherein the covering layer at a bottom of the contact hole has a thickness of less than about 10 nm.

13. The integrated circuit according to claim 12 further comprising an intermediate layer arranged between the base layer and the covering layer, wherein at least about eighty percent of the atoms of the intermediate layer comprise titanium atoms.

14. The integrated circuit according to claim 13, wherein the base layer and the intermediate layer comprise a composite layer at a bottom surface of the contact hole having a thickness of less than about 5 nm.

* * * * *

UNITED STATES PATENT AND TRADEMARK OFFICE
CERTIFICATE OF CORRECTION

| | | |
|---|---|---|
| PATENT NO. | : 7,390,737 B2 | Page 1 of 1 |
| APPLICATION NO. | : 10/511851 | |
| DATED | : June 24, 2008 | |
| INVENTOR(S) | : Förster et al. | |

It is certified that error appears in the above-identified patent and that said Letters Patent is hereby corrected as shown below:

In the Claims:

Column 8, lines 4-25 delete Claims 12 through 14.

Signed and Sealed this

Thirty-first Day of March, 2009

JOHN DOLL
*Acting Director of the United States Patent and Trademark Office*